United States Patent [19]

Cooke

[11] Patent Number: 5,607,538
[45] Date of Patent: Mar. 4, 1997

[54] METHOD OF MANUFACTURING A CIRCUIT ASSEMBLY

[75] Inventor: William E. Cooke, Dearborn Heights, Mich.

[73] Assignee: Ford Motor Company, Dearborn, Mich.

[21] Appl. No.: 524,498

[22] Filed: Sep. 7, 1995

[51] Int. Cl.[6] .................................................. H05K 7/20
[52] U.S. Cl. .......................... 156/291; 156/292; 361/705; 361/719
[58] Field of Search ..................................... 156/290, 291, 156/292; 361/704, 705, 717, 718, 719

[56] References Cited

U.S. PATENT DOCUMENTS

| | | |
|---|---|---|
| 4,325,771 | 4/1982 | Brower et al. . |
| 4,612,601 | 9/1986 | Watari . |
| 4,706,166 | 11/1987 | Go . |
| 4,818,823 | 4/1989 | Bradley . |
| 4,935,086 | 6/1990 | Baker et al. . |
| 4,935,090 | 6/1990 | Brower . |
| 5,003,429 | 3/1991 | Baker et al. . |
| 5,010,444 | 4/1991 | Storrow ................................... 361/719 |
| 5,051,645 | 9/1991 | Brace et al. . |
| 5,065,279 | 11/1991 | Lazenby et al. ........................ 361/720 |
| 5,141,050 | 8/1992 | Schuft . |
| 5,172,301 | 12/1992 | Schneider ................................ 361/717 |
| 5,172,755 | 12/1992 | Samarov . |
| 5,173,839 | 12/1992 | Metz, Jr. ................................. 361/704 |
| 5,195,021 | 3/1993 | Ozmat et al. . |
| 5,268,048 | 12/1993 | Leibovitz et al. . |
| 5,280,409 | 1/1994 | Selna et al. . |
| 5,291,062 | 3/1994 | Higgins, III . |
| 5,297,006 | 3/1994 | Mizukoshi . |
| 5,308,429 | 5/1994 | Bradley . |
| 5,311,398 | 5/1994 | Schirmer et al. . |
| 5,410,451 | 4/1995 | Hawthorne et al. ..................... 361/719 |
| 5,467,251 | 11/1995 | Katchmar ................................ 361/705 |
| 5,504,653 | 4/1996 | Murphy ................................... 361/719 |

FOREIGN PATENT DOCUMENTS 64-76799  3/1989  Japan .

*Primary Examiner*—Daniel Stemmer
*Attorney, Agent, or Firm*—Damian Porcari

[57] ABSTRACT

A method of manufacturing a circuit assembly is provided. The circuit assembly (10) manufactured according to the present invention includes a circuit board (12) and a heat sink (22). The circuit board (12) has a first side (16) and a second side (20), and each of these sides (16, 20) has one or more electronic components (14, 18) mounted thereon. The heat sink (22) also includes a first side (34) and a second side (43), the first side (34) having a recessed portion (24) therein. The method of manufacturing the circuit assembly (10) includes the step of dispensing a heat curable adhesive (26) between the mating surfaces (30, 32) of the second side (20) of the circuit board (12) and the first side (34) of the heat sink (22). The method also includes the step of positioning the circuit board (12) such that the component (18) on its second side (20) is aligned with the recessed portion (24) of the heat sink (22). The method further includes the step of urging the mating surfaces (30, 32) towards one another and applying heat through the heat sink (22) to cure the adhesive (26).

16 Claims, 2 Drawing Sheets

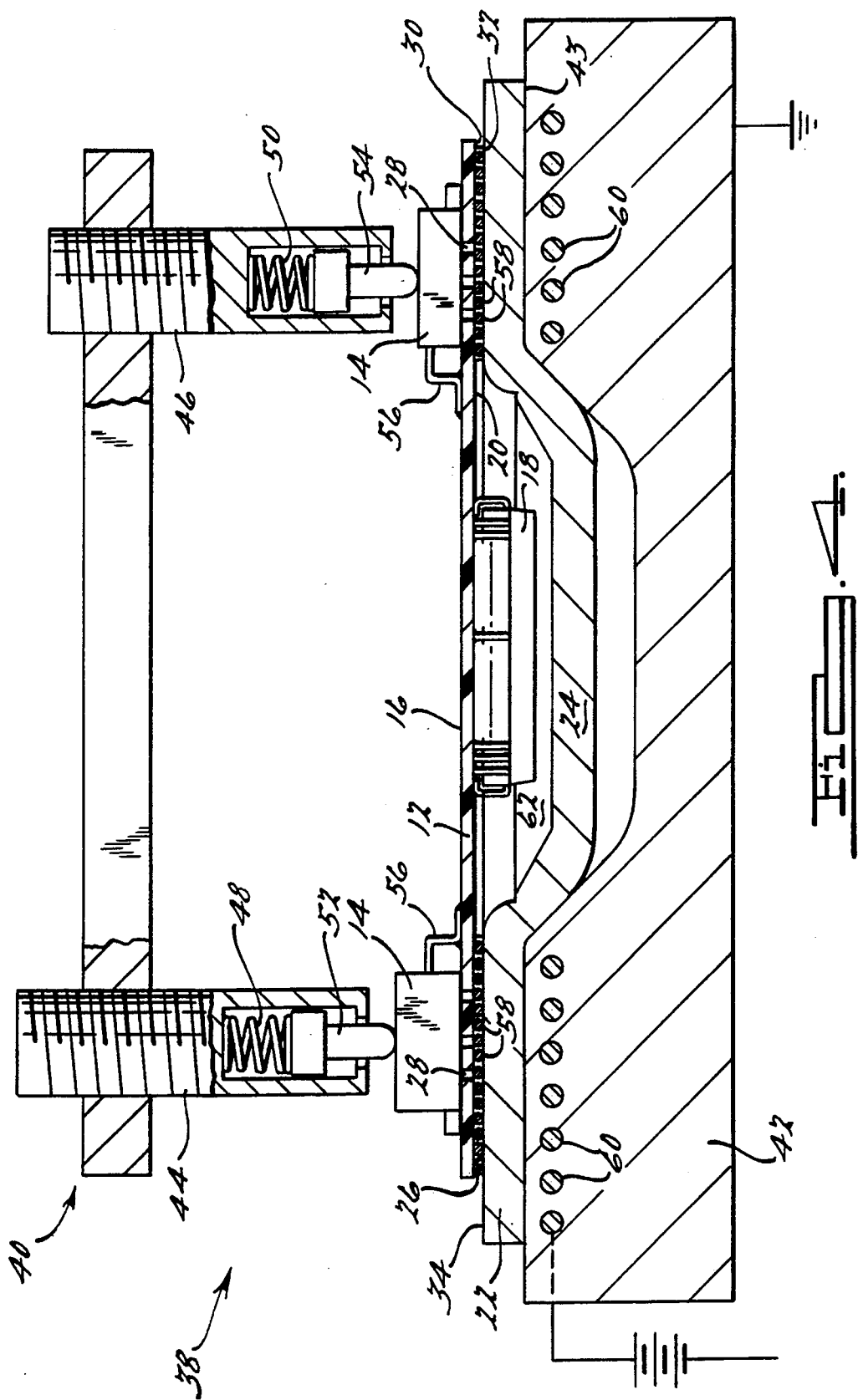

METHOD OF MANUFACTURING A CIRCUIT ASSEMBLY

BACKGROUND OF THE INVENTION

1. Field of the Invention

The present invention relates generally to a method of manufacturing a circuit assembly having a circuit board with electronic components mounted on opposite sides thereof and a heat sink. More particularly, the present invention relates to a method of curing an adhesive provided between the circuit board and the heat sink by applying heat to the adhesive through the heat sink.

2. Description of Related Art

Heat sinks are often included in modern circuit assemblies to transfer heat away from board-mounted, electronic components. These circuit assemblies are often designed such that the heat sink is adhesively bonded to a side of the circuit board opposite from the side populated by the electronic components. One known method for manufacturing such an assembly includes applying an adhesive between the heat sink and the unpopulated side of the board and convection curing the adhesive in an oven.

This approach has been found to be disadvantageous for several reasons. First, board space cannot be utilized in the most effective manner by concentrating the components on a single side of the board. Second, the components and circuit board selected must be capable of withstanding exposure to the desired oven curing temperature. If the oven temperature is reduced to accommodate more temperature-sensitive components and circuit boards, the time required to cure the adhesive can increase significantly, decreasing the efficiency of the process. Even at normal oven curing temperatures, the process is relatively slow, generally requiring cycle times of about 20–40 minutes for conventional heat curable adhesives. Another problem associated with oven curing is that it is difficult to apply pressure to the adhesive during the curing cycle. As a result, it is difficult to control the thickness and quality of the adhesive bondline that joins the heat sink to the circuit board. Mechanical fasteners, such as screws, rivets and clips, have been used to compress the adhesive during oven curing, but such fasteners cannot tightly control the adhesive bondline, especially beneath the components. Moreover, such fasteners increase the overall size, weight and cost of the circuit assembly.

Given the above-described drawbacks of the prior art, it would be desirable to provide a method for manufacturing a circuit assembly that permits temperature-sensitive circuit boards having temperature-sensitive electronic components mounted on opposite sides thereof to be adhesively bonded to a heat sink without the need for an extended oven cure.

Moreover, it would be desirable to provide a method for manufacturing a circuit assembly that enables the adhesive to be cured more rapidly than in conventional oven curing processes.

It would also be desirable to provide a method for manufacturing a circuit assembly that permits a uniform adhesive bondline to be formed between the circuit board and the heat sink.

SUMMARY OF THE INVENTION

The present invention provides a method of manufacturing a circuit assembly which overcomes the disadvantages of the prior art. The circuit assembly manufactured according to the present invention includes a circuit board and a heat sink. The circuit board has a first side and a second side, and each of these sides has one or more electronic components mounted thereon. The heat sink also includes a first side and a second side, the first side having a recessed portion therein. Corresponding mating surfaces are provided on the second side of the circuit board and the first side of the heat sink. The method of manufacturing the circuit assembly includes the step of dispensing a heat curable adhesive onto at least one of the mating surfaces. The method also includes the step of aligning the mating surfaces such that the component on the second side of the board fits within the recessed portion of the heat sink. The method further includes the step of urging the mating surfaces towards one another and applying heat through the heat sink to cure the adhesive such that the components are exposed to a lesser amount of heat than the adhesive during the process.

According to one aspect of the present invention, the first side of the circuit board is a high temperature side having one or more high temperature components thereon, and the second side of the circuit board is a low temperature side having one or more low temperature components thereon.

According to another aspect of the present invention, the method further includes the step of placing the heat sink and circuit board combination in a tool having a platen and a heated base, the tool being operable between an open position and a closed position. At least one projection is provided between the platen and the circuit board such that when the tool is moved from the open position to the closed position, the projection urges the mating surfaces together and distributes the adhesive therebetween. The projection may be positioned such that it applies force directly to a component on the first side of the circuit board.

As those ordinarily skilled in the art will recognize, circuit board utilization may be improved by using double-sided circuit boards, and board utilization may be further improved by separating high temperature electronic components from low temperature electronic components in the manner described above. Several advantages result from increasing the circuit board density according to the teachings of the present invention. First, for any desired amount of functionality, the size and therefore the cost of the circuit board is reduced. In addition, shorter traces may be used to interconnect the components. Shorter traces offer the dual advantage of being less susceptible to electromagnetic interference and of generating less heat during operation.

Several additional advantages are realized by providing a method wherein heat is applied by thermal conduction through the heat sink to cure the adhesive. First, the method allows for more rapid curing of the adhesive than is possible with conventional oven curing processes in which heat is transferred by convection. Second, since the circuit board and components are not heated to the same extent as the adhesive during the curing cycle, temperature-sensitive circuit boards and components may be used. In addition, higher temperatures may be used to cure the adhesive, decreasing the cycle times even further relative to conventional oven curing methods.

The present invention also solves the problems associated with the prior art with respect to achieving a high quality adhesive bondline by urging the mating surfaces of the heat sink and circuit board together during the curing cycle and by applying localized forces to those components and areas of the circuit board where it is desirable to closely control the bondline.

BRIEF DESCRIPTION OF THE DRAWINGS

FIG. 4 is a sectional view illustrating a tool used in the manufacture of the circuit assembly shown in FIG. 1.

DESCRIPTION OF THE PREFERRED EMBODIMENTS

Figure 1:
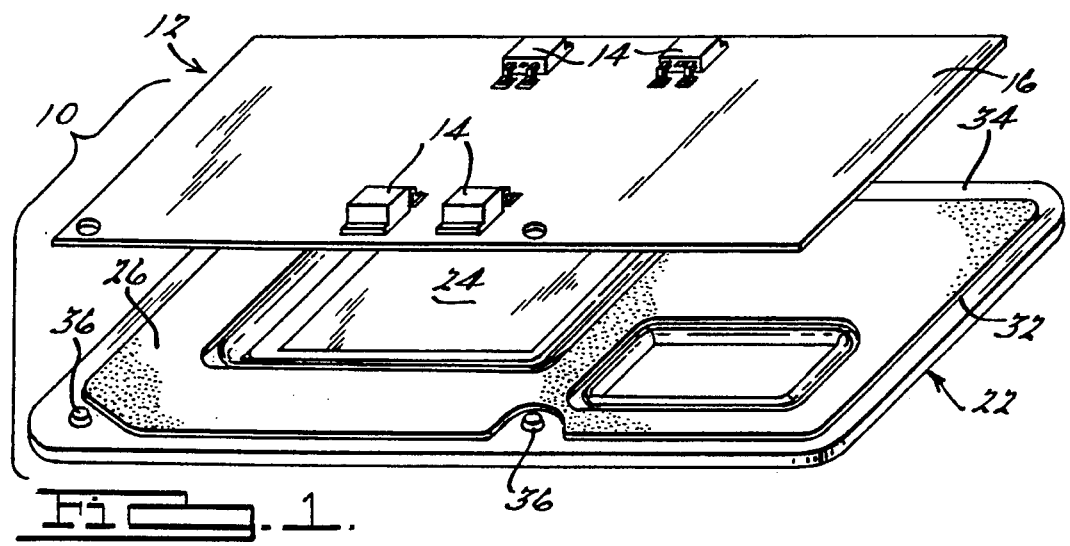
FIG. 1 is an exploded perspective view of a circuit assembly having a circuit board and a heat sink.

The present invention relates to a method of manufacturing a high density electronic circuit assembly. As illustrated in FIGS. 1–4, a circuit assembly 10 manufactured according to the present invention includes a double-sided circuit board 12. In a preferred embodiment of the invention, high temperature electronic components 14 are provided on a first, high temperature side 16 of circuit board 12, and a low temperature electronic component 18 is provided on a second, low temperature side 20. A heat sink 22 having a recessed portion 24 for receiving low temperature component 18 is attached to circuit board 12 by means of a heat curable, thermally conductive adhesive 26.

Figure 2:
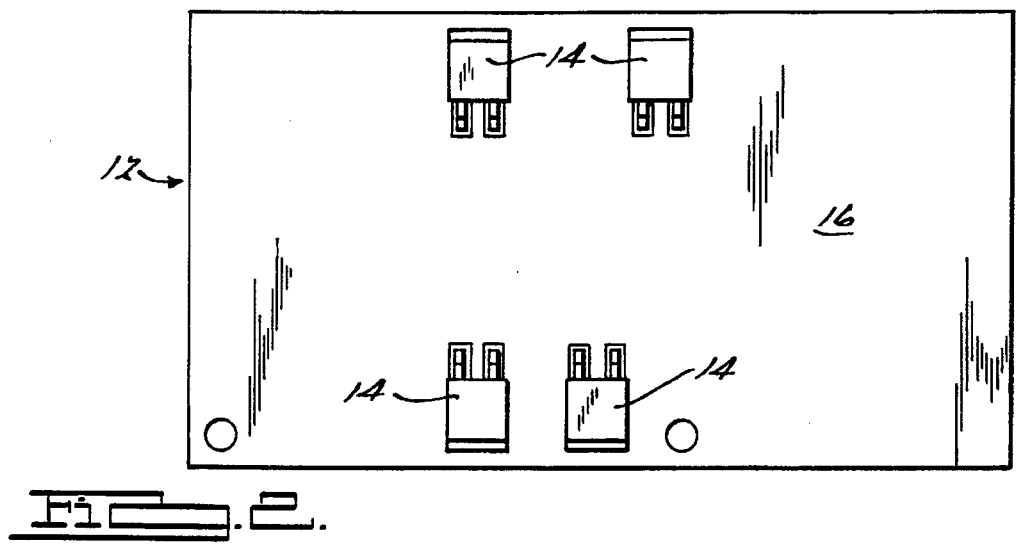
FIG. 2 is a plan view of a first side of the circuit board shown in FIG. 1.

High temperature side 16 of circuit board 12 is illustrated in FIG. 2. High temperature components 14 on high temperature side 16 are devices, such as power transistors, which generate a relatively large amount of heat during operation. Other devices (not shown) will normally also be provided on high temperature side 16. These other devices should be sufficiently heat-resistant to function properly in the vicinity of high temperature components 14. While four high temperature components 14 are depicted, those ordinarily skilled in the art will understand that the number of high temperature components 14 used in any particular circuit assembly will depend on the intended use of the circuit assembly.

Figure 3:
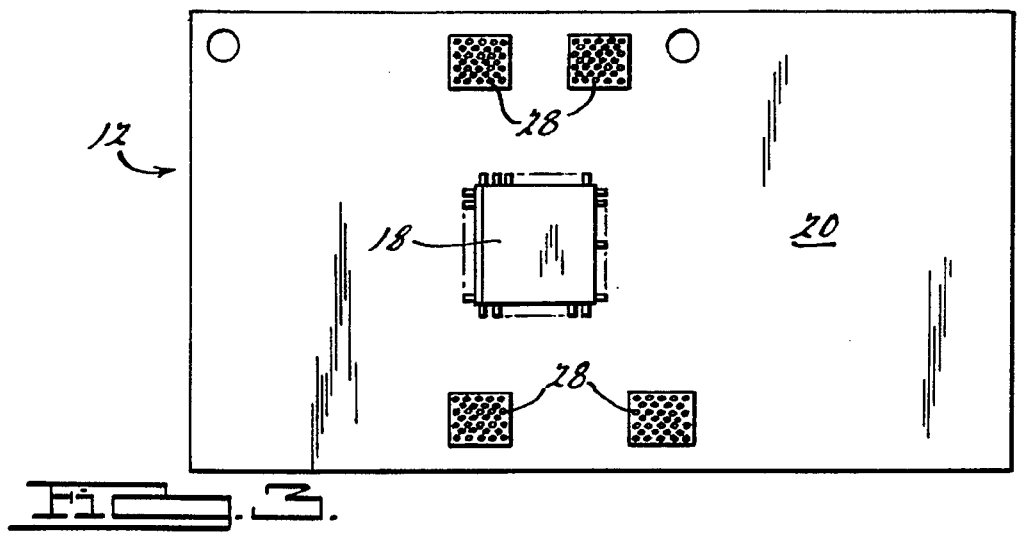
FIG. 3 is a plan view of a second side of the circuit board shown in FIG. 1.

Low temperature side 20 of circuit board 12 is illustrated in FIG. 3. Low temperature component 18 on low temperature side 20 generates less heat during operation than high temperature components 14 and does not need to be cooled by heat sink 22. In a preferred embodiment of the invention, low temperature component 18 is a microprocessor. More than one low temperature component 18 may be provided on low temperature side 20, depending again on the intended use of the circuit assembly.

As illustrated in FIGS. 3 and 4, thermal vias 28 may be provided in circuit board 12 to transfer heat away from high temperature components 14. Preferably, at least a portion of the vias 28 are positioned beneath high temperature components 14. In one embodiment of the present invention, vias 28 are hollow, thermally conducting tubes (e.g., copper tubes) extending through and lining apertures in circuit board 12. These vias 28 are filled with a solder mask (not shown) to prevent solder flux from the surface mounting operation from passing through the apertures and contacting adhesive 26.

Adhesive 26 overlies vias 28 on low temperature side 20 of circuit board 12. During operation of circuit assembly 10, heat generated by high temperature components 14 is transferred through circuit board 12 by vias 28 to adhesive 26. Since adhesive 26 is thermally conducting, the heat then passes through adhesive 26 to heat sink 22.

Heat sink 22 may comprise any thermally conductive material. Commonly used materials include metals, such as aluminum and copper, and thermally conducting ceramics. Where the material of heat sink 22 is electrically conductive in addition to being thermally conductive, an electrically insulating material may be selected for adhesive 26 to prevent heat sink 22 from interfering with the operation of circuit board 12 and the components thereon. Suitable materials for adhesive 26 include, for example, epoxies, silicones, acrylics and urethanes.

Turning now to the manufacture of circuit assembly 10, adhesive 26 is dispensed between mating surfaces 30, 32 of circuit board 12 and heat sink 22, respectively. As used herein, mating surfaces 30, 32 are those respective portions of low temperature side 20 of circuit board 12 and first side 34 of heat sink 22 that are to be bonded together by adhesive 26. Adhesive 26 may initially be applied as a liquid or a paste to one or the other or both mating surfaces 30, 32. Any conventional method for dispensing adhesive 26 may be used, though the deposition will preferably be robotically controlled.

As depicted in FIG. 4, circuit board 12 is positioned relative to heat sink 22 such that mating surface 30 is aligned with mating surface 32 and low temperature component 18 fits within recessed portion 24. Locators 36 may be used to ensure proper alignment (see FIG. 1). In the illustrated embodiment, heat sink 22 is intended to comprise a part of the housing for circuit assembly 10. Thus, recessed portion 24 is formed as a well in heat sink 22 that is sized to surround low temperature component 18. Where heat sink 22 is not intended to protect component 18, recessed portion 24 may simply be an opening in heat sink 22.

Heat sink 22, with circuit board 12 positioned thereon, is placed in a tool 38 having a platen 40 and a heated base 42. At least a portion of second side 43 of heat sink 22 is seated against base 42. Tool 38 is operable between an open position and a closed position, such movement being effected in any conventional manner as, for example, through the use of a pneumatic cylinder (not shown). In the open position, platen 40 and base 42 are sufficiently separated to allow the heat sink 22 and circuit board 12 combination to be loaded into tool 38. In closing tool 38, either platen 40 or base 42 may be moved towards the other. Alternatively, both platen 40 and base 42 may be movable.

Platen 40 may be a flat plate, or as illustrated in FIG. 4, platen 40 may be provided with one or more projections 44, 46. Projections 44, 46 may be fixed or adjustable, compliant or rigid. In the embodiment shown, projections 44, 46 are threaded into platen 40. Each projection 44, 46 includes a biasing member 48, 50, such as a spring, and a plunger 52, 54. When tool 38 is moved to the closed position, each plunger 52, 54 contacts one of the high temperature components 14. Projections 44, 46 are individually adjustable, so that plungers 52, 54 can easily supply a uniform, predetermined force to high temperature components 14 even though components 14 are of different heights. If desired, projections 44, 46 can also be adjusted to supply a different force to each of the components 14. The force applied to $D^2$ pack devices will generally be from about 1–5 lbs. Since components 14 are mounted flush against circuit board 12, plungers 52, 54 are able to press against components 14 without damaging either the components 14 or the leads 56. Upon contacting components 14, plungers 52, 54 urge mating surfaces 30, 32 together and distribute adhesive 26 therebetween.

As described above, projections 44, 46 may be positioned to simultaneously contact components of different heights. Alternatively, projections 44, 46 may be positioned to contact only circuit board 12 or to simultaneously contact both circuit board 12 and one or more of the components thereon. Other embodiments are also possible. For example, projections could be provided on circuit board 12 rather than, or in addition to, being provided on platen 40. In general, projections are provided over those components and areas of the circuit board where it is desirable to closely control the adhesive bondline to ensure that the proper bond strength, thermal conductivity and electrical resistivity is achieved.

In a preferred embodiment of the invention, spacers 58 are positioned between mating surfaces 30, 32 of circuit board 12 and heat sink 22. Spacers 58 ensure that a minimum spacing and a corresponding minimum adhesive thickness is maintained between mating surfaces 30, 32. Maintaining a minimum spacing between mating surfaces 30, 32 is important, since electrical shorting can occur if circuit board 12 and an electrically conductive heat sink 22 are allowed to come into contact. Maintaining a minimum adhesive thickness between mating surfaces 30, 32 is also important to ensure that the desired bond strength is achieved. As illustrated in FIG. 4, spacers 58 may be conveniently provided in adhesive 26 in the form of, for example, glass beads. Alternatively, spacers could be provided on circuit board 12 or heat sink 22. These spacers might comprise integral raised portions of circuit board 12 or heat sink 22, or they might be discrete objects bonded to circuit board 12 or heat sink 22, such as shims, wires, potting compound, or cured solder.

Base 42 of tool 38 is heated through a plurality of resistive heating elements 60 while tool 38 is closed and projections 44, 46 are applying force to mating surfaces 30, 32. Heating elements 60 are preferably concentrated near those portions of heat sink 22 that are seated on base 42 and are adjacent adhesive 26. The heat generated by heating elements 60 during the operation thereof passes through heat sink 22 to rapidly cure adhesive 26. Curing times for conventional adhesives will typically be less than about five minutes, preferably less than about three minutes, and more preferably less than about two minutes. Since the heat path is from base 42 to heat sink 22 to adhesive 26, circuit board 12 and components 14, 18 remain cooler than adhesive 26, so that heat damage to the components during the curing cycle is unlikely. Low temperature component 18 is further protected from any heat damage during the curing cycle by insulating air gap 62.

The foregoing description presents the preferred embodiments of the present invention. Other embodiments may be possible without departing from the scope of the appended claims.

What is claimed is:

1. A method of manufacturing a circuit assembly including a circuit board having first and second sides with at least one electronic component mounted on each of said sides, and a heat sink attached to said circuit board, said heat sink having first and second sides, said first side having a recessed portion, said second side of said circuit board and said first side of said heat sink each having corresponding mating surfaces, comprising the steps of:

dispensing a thermally conductive, heat curable adhesive onto at least one of said mating surfaces;

aligning said mating surfaces such that said at least one component on said second side of said circuit board fits within said recessed portion of said heat sink; and urging said mating surfaces towards one another and applying heat through said heat sink to cure said adhesive, such that said components are exposed to a lesser amount of heat than said adhesive.

2. The method of claim 1, wherein said urging step comprises applying force to at least one component on said first side of said circuit board.

3. The method of claim 1, further comprising the step of positioning spacers between said mating surfaces to maintain a minimum spacing therebetween.

4. The method of claim 1, further comprising the step of providing thermal vias in said circuit board, wherein at least a portion of said thermal vias are positioned beneath said at least one component on said first side of said circuit board to transfer heat away from said component.

5. The method of claim 1, wherein said first side of said circuit board is a high temperature side having at least one high temperature component thereon and said second side of said circuit board is a low temperature side having at least one low temperature component thereon.

6. The method of claim 5, further comprising the step of providing thermal vias in said circuit board, wherein at least a portion of said thermal vias are positioned beneath said at least one high temperature component to transfer heat away from said high temperature component.

7. A method of manufacturing a circuit assembly including a circuit board having first and second sides with at least one electronic component mounted on each of said sides, and a heat sink attached to said circuit board, said heat sink having first and second sides, said first side having a recessed portion, said second side of said circuit board and said first side of said heat sink each having corresponding mating surfaces, comprising the steps of:

dispensing a thermally conductive, heat curable adhesive onto at least one of said mating surfaces;

aligning said mating surfaces such that said at least one component on said second side of said circuit board fits within said recessed portion of said heat sink;

placing said heat sink in a tool having a platen and a heated base, said tool being operable between an open and a closed position;

placing one or more projections between said platen and said circuit board;

moving said tool from said open position to said closed position and causing said one or more projections to urge said mating surfaces together to distribute said adhesive between said mating surfaces; and applying heat through said heat sink to cure said adhesive such that said components are exposed to a lesser amount of heat than said adhesive.

8. The method of claim 7, wherein said one or more projections urges said mating surfaces together by applying force to said at least one component on said first side of said circuit board.

9. The method of claim 7, wherein said heated base comprises a plurality of resistive heating elements for generating said heat.

10. The method of claim 7, wherein each of said projections comprises a biasing member and a plunger.

11. The method of claim 7, further comprising the step of positioning spacers between said mating surfaces to maintain a minimum spacing therebetween.

12. The method of claim 7, further comprising the step of providing thermal vias in said circuit board, wherein at least a portion of said thermal vias are positioned beneath said component on said first side of said circuit board to transfer heat away from said component.

13. The method of claim 7, wherein said first side having said circuit board is a high temperature side having at least one high temperature component thereon and said second side of said circuit board is a low temperature side having at least one low temperature component thereon.

14. The method of claim 13, further comprising the step of providing thermal vias in said circuit board, wherein at least a portion of said thermal vias are positioned beneath said at least one high temperature component to transfer heat away from said high temperature component.

15. The method of claim 7, wherein the step of placing one or more projections between said platen and said circuit board comprises providing said platen with a plurality of adjustable projections.

16. The method of claim 15, further comprising the step of adjusting the height of each of said projections so that each of said projections supplies a predetermined force to said mating surfaces when said tool is moved to said closed position.

* * * * *